United States Patent
Dong et al.

(10) Patent No.: US 6,790,728 B1
(45) Date of Patent: Sep. 14, 2004

(54) METHOD OF MANUFACTURING A FLASH MEMORY

(75) Inventors: Cha Deok Dong, Ichon-Shi (KR); Il Keoun Han, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/617,057

(22) Filed: Jul. 10, 2003

(30) Foreign Application Priority Data

Dec. 18, 2002 (KR) .............................. 10-2002-0081254

(51) Int. Cl.$^7$ ............................................. H01L 21/336
(52) U.S. Cl. ...................................... 438/257; 438/258
(58) Field of Search ......................................... 438/257

(56) References Cited

U.S. PATENT DOCUMENTS

| | | | |
|---|---|---|---|
| 5,327,378 A | | 7/1994 | Kazerounian |
| 5,393,686 A | | 2/1995 | Yeh et al. |
| 6,124,157 A | * | 9/2000 | Rahim .......................... 438/201 |
| 6,207,991 B1 | * | 3/2001 | Rahim .......................... 257/326 |
| 6,559,012 B2 | * | 5/2003 | Shukuri et al. ............. 438/275 |
| 2002/0079533 A1 | * | 6/2002 | Horiguchi et al. .......... 257/315 |

FOREIGN PATENT DOCUMENTS

| | | |
|---|---|---|
| EP | 0405205 A2 | 1/1991 |
| EP | 0461764 A2 | 12/1991 |

OTHER PUBLICATIONS

Search Report from the German Patent and Trademark Office dated Dec. 5, 2003 (3 pages).

* cited by examiner

*Primary Examiner*—David Nelms
*Assistant Examiner*—Thao P. Le
(74) *Attorney, Agent, or Firm*—Marshall, Gerstein & Borun LLP

(57) ABSTRACT

Disclosed is a method of manufacturing a flash memory device. A sidewall oxidization process using a mixed gas of $O_2$ and TCA is implemented to reinforce isolation of the floating gate, and prevent a phenomenon that the thickness of the sidewall of the oxide film included within the dielectric film is thickness and a phenomenon that the thickness of the sidewall of the tunnel oxide film is thickened.

5 Claims, 3 Drawing Sheets

METHOD OF MANUFACTURING A FLASH MEMORY

RELATED APPLICATION DATA

This application claims the benefit of foreign priority under 35 U.S.C. §119 of Korean patent application number 2002-0081254 filed Dec. 18, 2002.

BACKGROUND OF THE INVENTION

1. Field of the Invention

The present invention relates to a method of manufacturing a semiconductor device, and more particularly, to a method of forming a sidewall oxide films for protecting a gate electrode at the sidewall of the gate electrode in a flash memory cell.

2. Background of the Related Art

In general, in implementing the flash memory devices, after the gate electrode is formed, a dry oxidization process using $O_2$ is implemented for the gate sidewall in order to compensate for etch damage obtained when the floating gate is isolated and gate is etched. At this time, it is advantageous to thickly form the sidewall oxide films formed by sidewall oxidization from the viewpoint of sidewall reinforcement and compensation of etch damage. In order to form a thick sidewall oxide film, however, an oxidization process is performed for a long period of time. Thereby, a smiling phenomenon occurs that the thickness around the sidewalls of first and second oxide films and a tunnel oxide film among the dielectric film of a first oxide film/a nitride film/a second oxide film (oxide/nitride/oxide, ONO) structure that has been widely used as the dielectric film in the flash devices is increased. This causes to degrade characteristics of the device.

SUMMARY OF THE INVENTION

Accordingly, the present invention is contrived to substantially obviate one or more problems due to limitations and disadvantages of the related art.

An object of the present invention is to provide a method of manufacturing a semiconductor device capable of prohibiting a smiling phenomenon by implementing dry oxidization using an adequate mixed ratio of $O_2$ and TCA (tri-chloro-ethane, $C_2H_2Cl_3$) in a sidewall oxidization mode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing a flash memory device according to the present invention is characterized in that it comprises the steps of providing a semiconductor substrate in which a gate electrode including a tunnel oxide film, a floating gate, a dielectric film and a control gate is formed, and implementing a dry oxidization process using a mixed gas of $O_2$ and $C_2H_2Cl_3$ to form sidewall oxide films at the sidewalls of a gate electrode in order to compensate for damage due to an etch process for forming the gate electrode and reinforce isolation of the floating gate.

In another aspect of the present invention, it is to be understood that both the foregoing general description and following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1A:
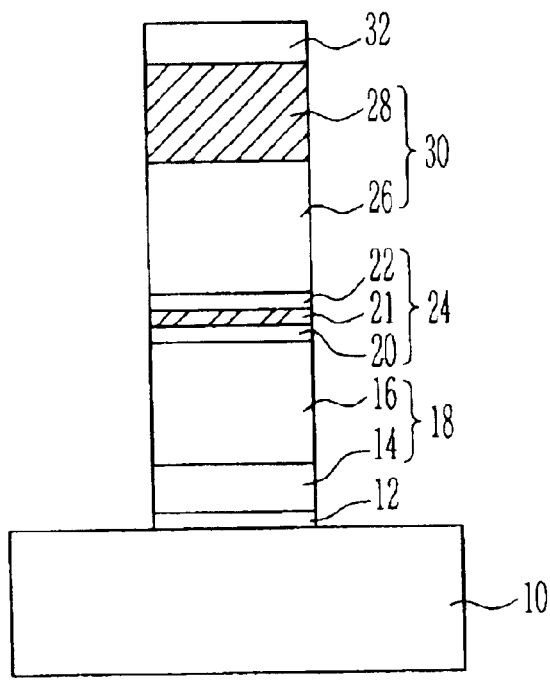
FIG. 1A and FIG. 1B are cross-sectional views of semiconductor devices for explaining a method of manufacturing the device according to a preferred embodiment of the present invention.

Reference will now be made in detail to the preferred embodiments of the present invention, examples of which are illustrated in the accompanying drawings, in which like reference numerals are used to identify the same or similar parts.

Figure 1B:
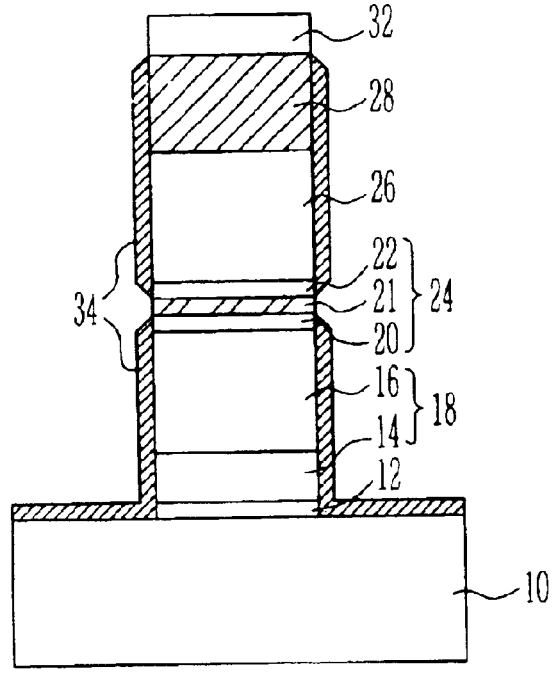

FIG. 1A and FIG. 1B are cross-sectional views of semiconductor devices for explaining a method of manufacturing the device according to a preferred embodiment of the present invention.

Referring to FIG. 1A, a screen oxide film (not shown) that serves as a buffer layer for prohibition of crystal defects on the surface of the substrate or surface processing and ion implantation is formed on a semiconductor substrate 10. Ion implantation is then implemented to form a well.

After the screen oxide film is removed, a tunnel oxide film 12, a first polysilicon film 14 and a pad nitride film (not shown) are sequentially deposited. The pad nitride film, the first polysilicon film 14, the tunnel oxide film 12 and semiconductor substrate 10 are then sequentially etched through ISO (isolation) mask patterning, thereby forming a trench (not shown) of a STI (shallow trench isolation) structure to define an active region and a field region.

In the above, the first polysilicon film 14 is formed by depositing an undoped amorphous silicon film of a low oxidization resistance of 250~500 Å in thickness by means of a chemical vapor deposition (CVD) method, a low pressure CVD (LPCVD), a plasma enhanced CVD (PECVD) or an atmospheric pressure CVD (APCVD) method at a temperature of 480~550° C. and pressure of 0.1~3.0 torr.

A dry oxidization or wet oxidization process for compensating for etch damage of the trench sidewall of the STI (shallow trench isolation) structure is implemented to make rounded the corners of the trench. Next, a high temperature oxide film (HTO) is thinly deposited on the entire structure and a densification process is then implemented at high temperature to form a liner oxide film (not shown). It should be noted that the above process of depositing the liner oxide film might be omitted in order to simplify the process. A high density plasma (HDP) oxide film (not shown) is then deposited on the entire structure to bury the inside of the trench. Thereafter, a polishing process using the pad nitride film as a stop layer is performed to remove the HDP oxide film 20 and the liner oxide film on the pad nitride film. An isolation film for isolating the devices is thus formed.

A nitride strip process using phosphoric acid ($H_3PO_4$) is implemented to etch the pad nitride film. A pre-treatment cleaning process using DHF is then implemented to remove a native oxide film and the remnants formed on the first polysilicon film 14. After a second polysilicon film 16 is deposited on the entire structure, a patterning process is performed to form a floating gate 18 consisting of the tunnel oxide film 12 and the first and second polysilicon films 14 and 16.

In the above, the second polysilicon film 16 is formed by depositing an amorphous silicon film into which a P concentration of 5.0E19~1.5E20 atoms/cc is doped in thickness of 1000~3000 Å by means of the CVD, LP-CVD, PE-CVD or AP-CVD method using $SiH_4$ or $Si_2H_6$ and $PH_3$ gas at a temperature of 480~550° C. and a pressure of 0.1~3.0 torr.

A dielectric film 24 is formed on the entire structure along its step, wherein the dielectric film 24 having the ONO (a first oxide film 20-a nitride film 21-a second oxide film 22; $SiO_2$—$Si_3N_4$—$SiO_2$) structure is formed. A third polysilicon film 26 being a material film for forming the control gate and a tungsten silicide ($WSi_x$) film 28 are then sequentially formed. After a hard mask film 32 is formed on the tungsten silicide film 28, a patterning process is implemented to form a hard mask pattern. A self-aligned etch process using the hard mask pattern as an etch mask is then implemented to remove the tungsten silicide film 28, the third polysilicon film 26 and the dielectric film 24, thereby forming a control gate 30 consisting of the third polysilicon film 26 and the tungsten silicide 28.

Or, the tunnel oxide film 12 and the first and second polysilicon films 14 and 16 for a floating gate are sequentially deposited on the semiconductor substrate 10 in which the isolation film (not shown) is formed. A patterning process is then implemented to etch the second polysilicon 16, the first polysilicon 14 and the tunnel oxide film 12, thus forming the floating gate 18.

The dielectric film 24, the third polysilicon 26, a metal film (tungsten silicide film 28) and the hard mask film 32 of the ONO structure are sequentially formed on the entire structure. A patterning process is then implemented to etch the hard mask film 32, the metal film 28, the third polysilicon film 26 and the dielectric film 24, thereby forming a flash memory cell including the control gate 30.

Those having skill in the art will appreciated that the present invention is not limited to the above embodiments but the gate electrode of the flash memory devices including the tunnel oxide film, the floating gate, the dielectric film and the control gate could be formed through processes of various types for forming the flash memory devices.

By reference to FIG. 1B, a sidewall oxidization process is implemented to form a sidewall oxide films 34 for compensating for damage of an etch process for forming a gate electrode and isolating the floating gate 18, at the sidewall of the gate electrode of the flash memory device.

In the concrete, before the sidewall oxidization process, a pre-treatment process using SC-1 (standard cleaning-1) containing $NH_4OH$, $H_2O_2$ and $H_2O$ is performed in order to prevent loss of the tunnel oxide film 12 and the oxide films 20 and 22 constituting the dielectric film 24 of the ONO structure. A dry oxidization process using a mixed gas of $O_2$ and TCA is then implemented to form sidewall oxide films 34 at the sidewalls of the gate electrode in the flash memory device. Next, the semiconductor substrate 10 in which the gate electrode is formed is loaded onto a chamber for an oxidization process at a temperature of 600~750° C. Oxidization is then implemented so that a sidewall oxide films 34 of 30~100 Å in thickness is formed on the semiconductor substrate 10, by raising the temperature inside the chamber up to 750~950° C. and then introducing an $O_2$ gas of 1~10 slm and a TCA($C_2H_2Cl_3$) gas of 0.1~1 slm into the chamber. Thereafter, the temperature inside the chamber is dropped and the semiconductor substrate 10 is then unloaded from the chamber. By doing so, sidewall oxidization having time shorter than conventional sidewall oxidization using only the $O_2$ gas could be implemented if the sidewall oxide films 34 of the same thickness is to be formed, since sidewall oxidization is smoothly performed but silicon within the ONO and the tunnel oxide film is less oxidized due to a fast reaction speed (fast formation of the oxide film) by the TCA gas. It is thus possible to minimize ONO smiling and smiling of the tunnel oxide film. Furthermore, as oxidization at the tip portion on the top of the floating gate that is made sharp due to influence had when the gate is etched is smoothly induced to cause oxidization of the same degree to the sidewall thickness, the charge retention capability of the device could be improved. The speed of oxidization using the TCA gas is faster by 10% than oxidization using only the $O_2$ gas.

Figure 2A:
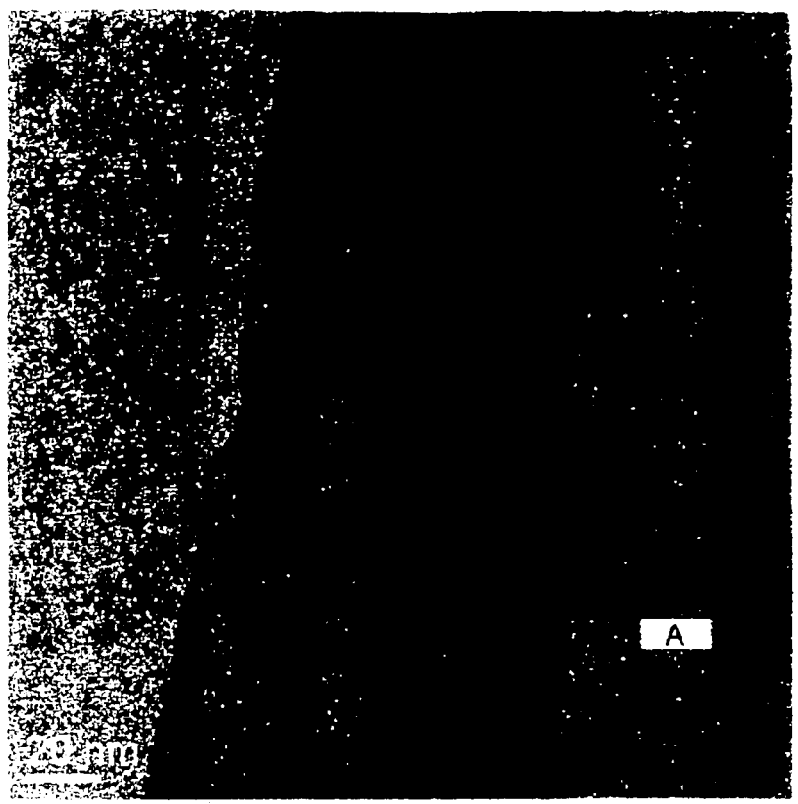
FIG. 2A and FIG. 2B are SEM (scanning electron microscope) photographs showing that a sidewall oxide films is formed at the sidewall of a gate electrode using a conventional $O_2$ gas only.
Figure 2B:
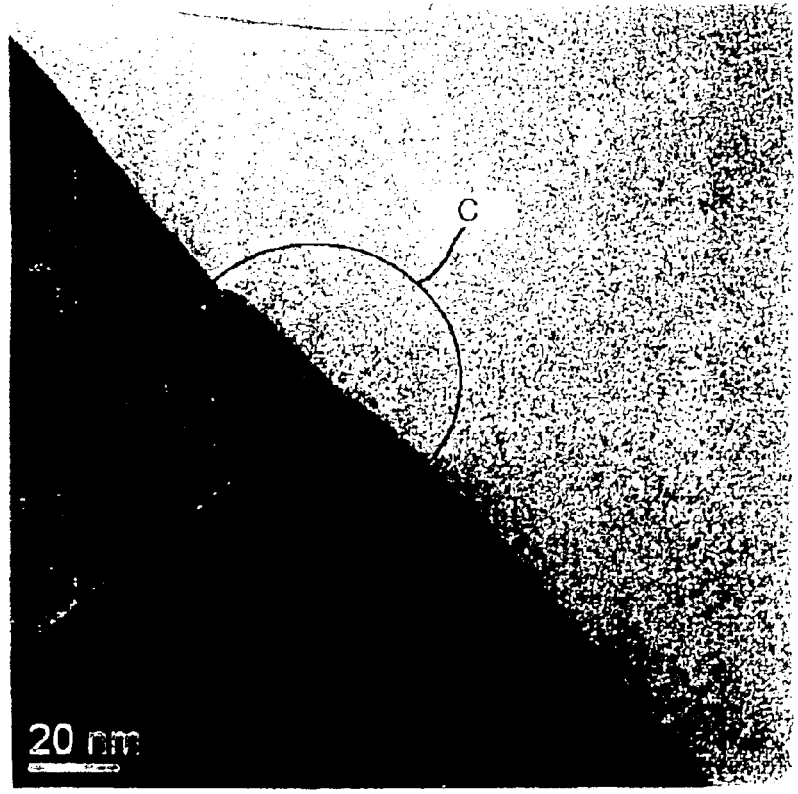
Figure 3A:
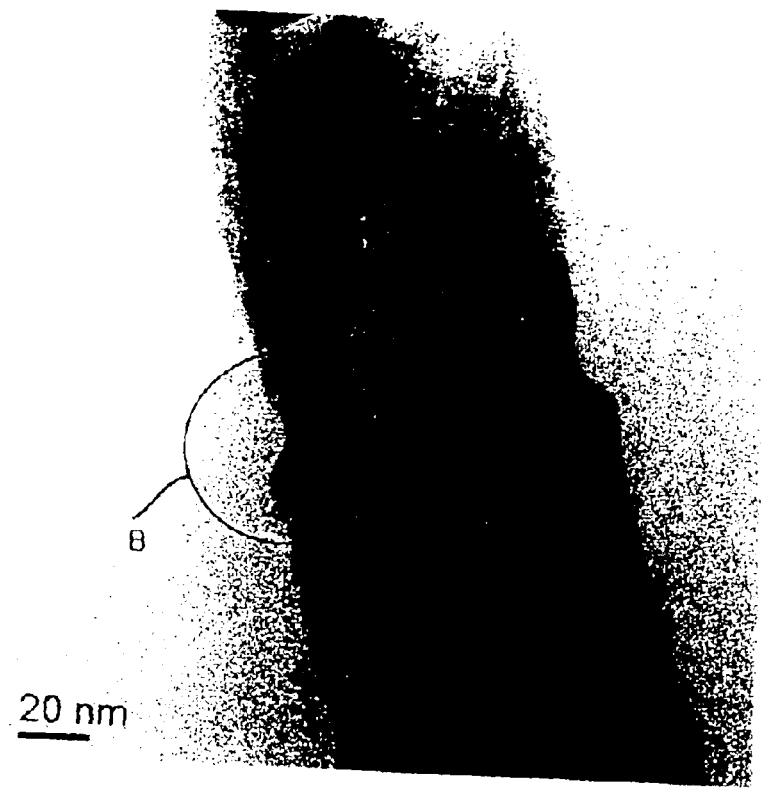
FIG. 3A and FIG. 3B are SEM (scanning electron microscope) photographs showing that a sidewall oxide films is formed at the sidewall of a gate electrode using a mixed gas of $O_2$ and TCA according to a preferred embodiment of the present invention.
Figure 3B:
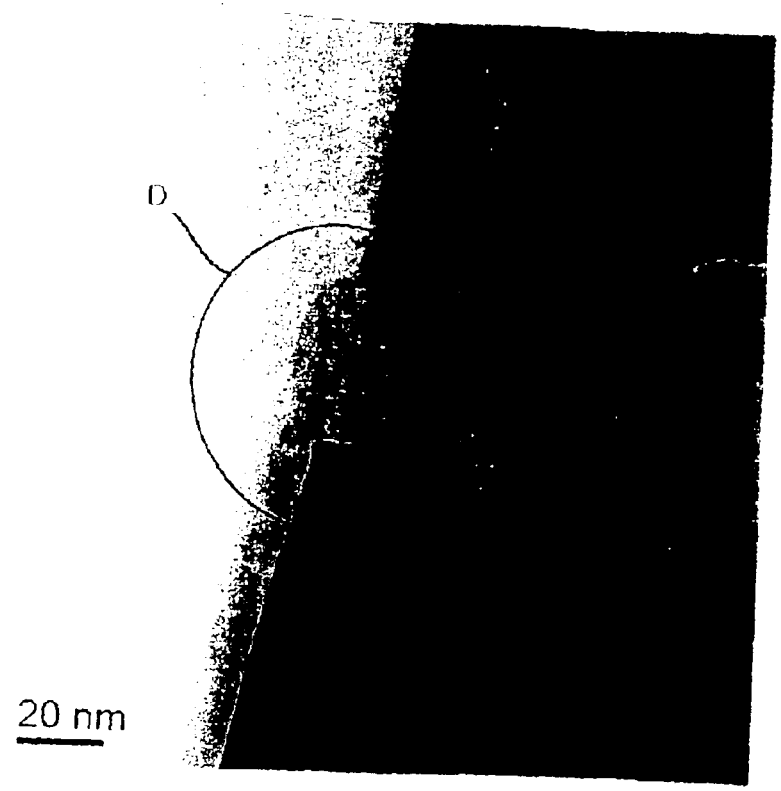

FIG. 2A and FIG. 2B are SEM (scanning electron microscope) photographs showing that a sidewall oxide films is formed at the sidewall of a gate electrode using a conventional $O_2$ gas only. FIG. 3A and FIG. 3B are SEM (scanning electron microscope) photographs showing that a sidewall oxide films is formed at the sidewall of a gate electrode using a mixed gas of $O_2$ and TCA according to a preferred embodiment of the present invention.

Referring to FIG. 2A, FIG. 2B, FIG. 3A and FIG. 3B, FIG. 2A and FIG. 3A are the SEM photographs of the sidewall oxide films formed in the dielectric film region of the ONO structure. FIG. 2B and FIG. 3B are the SEM photographs of the sidewall oxide films formed in the tunnel oxide film region. FIG. 2A and FIG. 2B illustrate the SEM photographs in which sidewall oxidization processes are implemented using targets of 30 Å and 50 Å, respectively, by use of only an $O_2$ gas at a temperature of 850° C. FIG. 3A and FIG. 3B illustrate the SEM photographs in which sidewall oxidization processes are implemented using targets of 30 Å and 50 Å, respectively, by use of a mixed gas of an $O_2$ gas and a TCA gas at a temperature of 850° C. From FIG. 2A, it can be seen that the oxide film is not formed in a sufficiently thick thickness at the sidewall of the dielectric film and the entire sidewall oxide films are unstable (not formed in a uniform thickness). On the contrary, from FIG. 3A, it can be seen that the sidewall oxide films of a sufficient thickness are formed at the sidewalls of the dielectric film and the sidewall oxide films of an entirely uniform thickness are formed. Furthermore, from FIG. 2B, it can be send that not only the oxide film of a sufficiently thick thickness is not formed at the sidewall of the tunnel oxide film but also the sidewall oxide films of a sufficiently thick thickness are not formed at the sidewalls of the first polysilicon film on the sidewall oxide film. On the contrary, from FIG. 3B, it can be seen that the sidewall oxide films of a sufficient thickness are formed not only at the sidewalls of the tunnel oxide film but also at the sidewall of the first polysilicon film.

As described above, the present invention has an advantageous effect that it can prevent a phenomenon that the thickness of the sidewall of the oxide film included within the dielectric film is thickened, by implementing a sidewall oxidization process using a mixed gas of $O_2$ and TCA. Also, the present invention has a new effect that it can secure a coupling ratio margin, by preventing a phenomenon that a total thickness of the oxide film included within the dielectric film is thickened through an oxidization process.

Furthermore, the present invention has a new effect that it can improve an entire operating characteristic of the device by reinforcing isolation of the floating gate and prohibiting a phenomenon that the thickness of the sidewall of the tunnel oxide film is thickened, through a sidewall oxidization process as of $O_2$ and TCA.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a flash memory device, comprising:
   (a) providing a semiconductor substrate in which a gate electrode including a tunnel oxide film, a floating gate, a dielectric film and a control gate is formed; and
   (b) implementing a dry oxidization process using a mixed gas of $O_2$ and $C_2H_2Cl_3$ to form sidewall oxide films at the sidewalls of the gate electrode in order to compensate for damage due to an etch process for forming the gate electrode and reinforce isolation of the floating gate.

2. The method as claimed in claim 1, wherein part (b) further comprises:
   loading the semiconductor substrate onto a deposition chamber;
   raising the temperature inside the deposition chamber to a first temperature;
   introducing an $O_2$ gas flow of 1~10 slm and a $C_2H_2Cl_3$ gas flow of 0.1~1 slm into the deposition chamber at the first temperature to form a sidewall oxide film; and
   unloading the semiconductor substrate from the deposition chamber.

3. The method as claimed in claim 2, wherein the first temperature is 750~950° C.

4. The method as claimed in claim 1, wherein the sidewall oxide films are formed in thickness of 30~100° C.

5. The method as claimed in claim 1, wherein part (a) further comprises:
   sequentially forming a tunnel oxide film, a first polysilicon film and a pad nitride film on the semiconductor substrate;
   etching the pad nitride film, the first polysilicon film, the tunnel oxide film and the semiconductor substrate through a patterning process to form a trench within the semiconductor substrate;
   depositing an oxide film on the entire structure including the trench and then polishing the oxide film so that the pad nitride film is exposed;
   etching the pad nitride film and then depositing a second polysilicon film on the entire structure;
   patterning the second polysilicon film to form a floating gate;
   depositing a dielectric film on the entire structure along its step; and
   forming a material film for a control gate on the dielectric film and then implementing a patterning process to form the control gate.

* * * * *

UNITED STATES PATENT AND TRADEMARK OFFICE
CERTIFICATE OF CORRECTION

PATENT NO. : 6,790,728 B1
DATED : September 14, 2004
INVENTOR(S) : Cha D. Dong et al.

It is certified that error appears in the above-identified patent and that said Letters Patent is hereby corrected as shown below:

Title page,
Item [57], ABSTRACT,
Line 6, after "film is," please delete "thickness" and insert -- thickened -- in its place.

Column 6,
Line 5, after "gas flow of," please delete "0.1 ~ 10 slm" and insert -- 0.1 ~ 10slm -- in its place.
Line 6, after "gas flow of," please delete "0.1 ~ 1 slm" and insert -- 0.1 ~ 1slm -- in its place.

Signed and Sealed this

Fifteenth Day of February, 2005

JON W. DUDAS
*Director of the United States Patent and Trademark Office*